United States Patent [19]
Radice

[11] Patent Number: 4,633,123
[45] Date of Patent: Dec. 30, 1986

[54] PIEZOELECTRIC POLYMER KEYBOARD APPARATUS

[75] Inventor: Peter F. Radice, King of Prussia, Pa.

[73] Assignee: Pennwalt Corporation, Philadelphia, Pa.

[21] Appl. No.: 738,710

[22] Filed: May 29, 1985

[51] Int. Cl.$^4$ ............................................. H01L 41/08
[52] U.S. Cl. .................................... 310/339; 310/363; 340/365 A
[58] Field of Search .............. 310/339, 800, 317, 319, 310/363–366; 340/365 A

[56] References Cited

U.S. PATENT DOCUMENTS

| | | | |
|---|---|---|---|
| 3,935,485 | 1/1976 | Yoshida et al. | 310/800 X |
| 3,940,637 | 2/1976 | Ohigushi et al. | 310/800 X |
| 4,071,785 | 1/1978 | Yoshida et al. | 310/800 X |
| 4,234,813 | 11/1980 | Iguchi et al. | 310/800 X |
| 4,328,441 | 5/1982 | Kroeger | 310/800 X |
| 4,516,112 | 5/1985 | Chen | 310/800 X |

Primary Examiner—Mark O. Budd

[57] ABSTRACT

An embodiment of a non-contact electrical keyboard switch which completely resists EMI and eliminates cross-talk comprises a pair of electrically insulating substrates having rows and columns of openings therethrough. A poled piezoelectric PVDF film is adhered to each substrate over the openings. The films have silk-screened ground electrodes deposited on one surface and signal generating key electrodes deposited on the other surface in registration with the openings. Leads connecting individual rows of key electrodes on one film and individual columns of key electrodes on other film are disposed orthogonally. An insulating sheet separates the films which have their key electrode surfaces facing each other. Leads are connected to ground and/or suitable electrical connectors to provide the keyboard switch. Processes are disclosed for fabricating embodiments of the keyboard switch.

5 Claims, 4 Drawing Figures

PIEZOELECTRIC POLYMER KEYBOARD APPARATUS

STATEMENT OF THE INVENTION

This invention relates to improved electrical keyboard switches which are resistant to EMI and provide no cross-talk, and to processes for making same.

BACKGROUND AND SUMMARY OF THE INVENTION

A key switch is capable of generating a voltage signal when an instant force is applied to the switch. The resultant voltage signal may be employed in applications involving computers, alphanumeric keyboards, kitchen appliances, intrusion detectors and numerous other electronic devices.

Conventional metal contact key switches become unreliable after extended periods of usage. For example, contact resistance tends to increase with age, and poor contact at the contact points produce undesirable chattering and/or bounce. In an effort to overcome the general unreliability of metal contact key switches, Hall effect key switches employing magnetic resistance elements, or capacitive key switches have been developed, each requiring elaborate or complicated parts and/or controlling circuits.

More recently, poled polymeric piezoelectric films functioning as the pressure sensing component have been developed, which films substantially overcome the deficiencies of metal contact key switches, as well as the deficiencies inherent in piezoelectric ceramics, which are hard, brittle, easily broken, difficult to machine into complex shapes, and often generate spurious voltage signals from sound waves bouncing off their surfaces.

Generally, polymeric materials are non-piezoelectric. Polyvinylidene fluoride (PVDF) however, may be made piezoelectric. PVDF is approximately 50% crystalline and 50% amorphous. The principal crystalline forms of PVDF are the highly polar $\beta$ form and the non-polar $\alpha$ form. High piezo response is associated with the polar $\beta$ form. By carefully controlling process steps to polarize the film, including mechanical orientation and treatment in an intense electric field, a highly piezoelectric and pyroelectric film results. Such a film is commercially available under the trademark KYNAR ®, a product of Pennwalt Corporation, Philadelphia, PA., assignee of the present invention.

The film is flexible, tough, and inexpensive, possesses a low modulus, and a low mechanical Q factor, and hence, little or no chattering. Many present day keyboards employ PVDF films as the piezoelectric sensing component therein. The invention is not limited to films made of PVDF only, and copolymers of vinylidene fluoride, and copolymerizable comonomers such as tetrafluoroethylene and trifluoroethylene, for example, may be employed.

In U.S. Pat. No. 4,234,813, split key keyboards are disclosed. The signal generating row and column signal areas are disposed on opposite sides of a PVDF film, for example, as well as the earth or ground electrodes. Cross-talk is eliminated by such design. A disadvantage of split key keyboards resides in its inability to completely eliminate cross-talk on keyboards involving a rather large number of key switches.

In British Pat. No. 1,550,691, a laminate of PVDF films, for example, for use in keyboard transducers, includes ground electrodes in face-to-face relationship to substantially eliminate cross-talk. The keyboard however is not resistant to EMI.

In FIG. 1 of U.S. Pat. No. 4,328,441, a structure is disclosed similar to an embodiment of a structure disclosed by applicant. The electrodes 14 and 18 however, are nickel or aluminum, for example, which are generally incapable of being strained indefinitely for switch application purposes.

In FIG. 11 of U.S. Pat. No. 3,940,637, a pair of poled PVDF films has electrodes formed on one face thereof with ground electrodes formed on the other faces. The films are piled one on top of the other with an electrically insulating film separating the PVDF films. The resultant composite is not EMI resistant nor are the electrodes believed capable of permitting indefinite straining of the piezoelectric sensors.

The present invention discloses apparatus and processes wherein the signal generating electrodes and lead lines thereto are preferably silk-screened onto a surface of a pair of poled piezoelectric PVDF films. The ground electrodes are silk-screened onto the other surface of each of the pair of films, either completely thereover, or localized to register with the signal generating electrodes on the opposing side thereof, but slightly larger in order to eliminate EMI.

The signal generating electrodes will be disposed in face-to-face relationship with an electrically insulating layer therebetween. The resultant composite may be deflected and strained millions of times without failure, chattering, or interference from electromagnetic radiation.

DETAILED DESCRIPTION OF THE INVENTION

Figure 1:
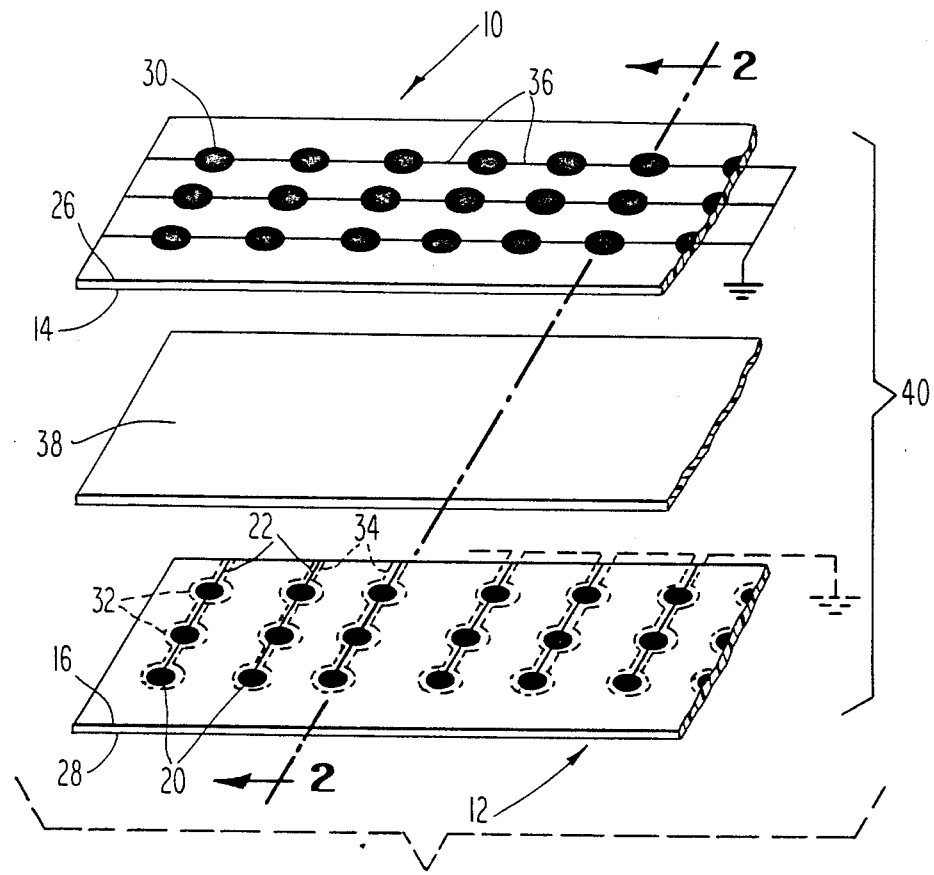
FIG. 1 is an exploded perspective view of one embodiment of a keyboard switch of the present invention.

Referring to the drawings, a pair of polymer films 10 and 12, suitably polyvinylidene fluoride (PVDF), poled by known means to render them piezoelectric and pyroelectric, are provided with signal generating or detecting electrodes, with an electrically insulating film therebetween to form a non-contact switch.

The electrodes and their leads may be deposited on the film surfaces by a silk screening process. The ink used in the silk screening process may comprise finely divided electrically conductive metal, typically silver, copper or nickel embedded in a suitable polymer matrix. The silk screened electrode deposits are compatible with the PVDF films; the resultant films with deposits thereon are capable of being deflected and strained millions of times at room temperature without failure in typical keyboard applications.

Figure 2:
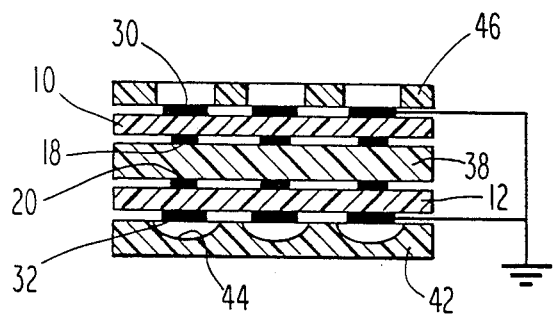
FIG. 2 is a sectional view of FIG. 1 looking in the direction of arrows 2—2, with supporting substrates in operative position.

The inner surfaces 14 and 16 of each poled PVDF film are deposited with signal generating or detecting electrodes, i.e., key electrodes 18 and 20 respectively. Individual rows of electrodes 20 deposited on the upper surface 16 of lower film 12 are connected along their Y-axes by leads 22 and provide Y-coordinate signals. Individual columns of electrodes 18 (FIG. 2) deposited on the lower surface 14 of upper film 10 are connected by leads (not shown) along their X-axes, orthogonally to leads 22, and provide the X-coordinate signals.

The outer or remaining surfaces 26 and 28 of films 10 and 12 are provided with earth or ground electrodes 30 and 32 respectively, in registration with the key electrodes associated therewith, but of slightly larger diameter to insure that no interference from unwanted electromagnetic radiation occurs. Ground electrodes 32 are shown by dotted lines (FIG. 1) indicating that electrodes 32 are deposited on the undersurface of lower film 12. Leads 34 and 36 connect individual rows and columns of ground electrodes on films 10 and 12 respectively. Leads 34 and 36 may be silk screened slightly larger in width than the leads associated with the key electrodes, and are grounded as shown.

It is understood that the leads from the signal generating or detecting electrodes and the ground electrodes are conventionally connected to electrical connectors (not shown) associated with the keyboard or other application.

It should be noted that section line 2—2 of FIG. 1 is not taken through leads 22 and 34 of the lower piezoelectric film 12 in order that a comparison can readily be made of the respective diameters between the key and ground electrodes. The outer surfaces of films 10 and 12 may optionally be provided with a ground electrode over their entire surfaces in lieu of the localized grounding electrodes shown in the drawings. Silk-screening the entire grounding surfaces, of course, requires considerably more conductive ink, and also results in complete EMI shielding.

Key electrodes 18 and 20 are disposed in face-to-face relationship with an electrically insulating film 38 therebetween. The resultant composite 40, i.e., the films 10 and 12 with insulating film 38 therebetween may be bonded together, for example, with any suitable adhesive or fastener.

Composite 40 may be provided with a support plate 42 (FIG. 2) having circular openings or wells 44 to accommodate deflection, depression or straining of the composite. Wells 44 need not be circular, and may be otherwise configured. Upper support plate 46 may also be provided as shown, having openings 48 disposed therein to permit pressure to be applied to the composite 40.

Typical thickness of composite 40 may be about 4 mils. The piezoelectric film thicknesses may range between $6\mu$ to $110\mu$, and preferably 16 to $50\mu$. The thickness of insulating film 38 may range between about 6 to $25\mu$, and should be sufficiently robust to meet the demands of the expected application. The silk-screened electrodes and leads will typically be about 5 to $7\mu$ thick.

Support plates 42 and 46 may be made from a suitable plastic or metal.

In fabricating composite 40, the key electrodes and leads are silk-screened onto a surface of each of two piezoelectric PVDF films to provide the signal generating or key electrodes. The leads on one of these surfaces are disposed along an X-axis and along the Y-axis on the other.

Ground electrodes and leads are silk-screened on the outer or remaining surfaces of the films, in registration with the key electrodes and their leads, the ground electrodes being preferably slightly larger in diameter than the key electrodes.

Insulating film 38 may now be suitably sandwiched between the films 10 and 12 and necessary leads connected conventionally to electrical connectors.

Since composite 40 requires 2 separate active piezoelectric films at each and every key site, a cost savings may be realized for applications involving larger areas, for example, such as floor areas to be sensed for illegal intrusion. Since it would be very costly to provide entire floor areas with a composite 40 structure including associated electronics, specific floor areas, for example, by doorways and windows may be sensed along with a few selected floor portions which will indicate the presence as well as the location of the intruder.

Figure 3A:
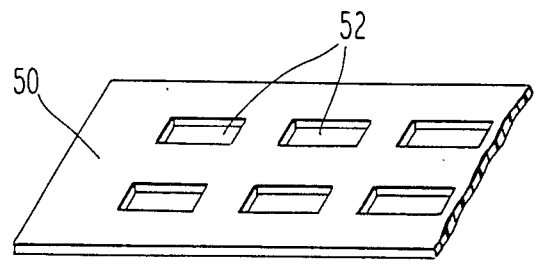
FIGS. 3A and 3B are perspective views of another embodiment of the invention.
Figure 3B:
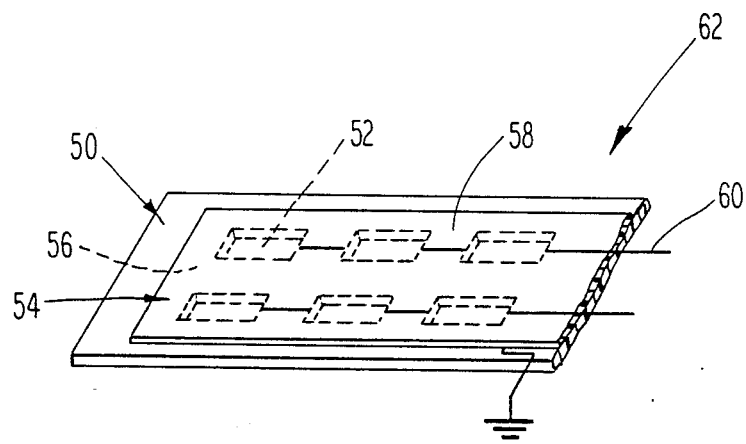

Reference is now made to FIGS. 3A and 3B wherein an electrically insulating substrate film 50, such as Mylar, for example, a polyethylene terephthalate product of DuPont, is provided with a plurality of spaced cut-out portions 52, shown rectangular but not limited thereto. A poled PVDF film 54 has one surface deposited with a ground electrode 56 and the other or upper surface 58 provided with key electrodes (not shown for clarity of illustration), in registration with cut-out portions 52. Key electrodes with connecting leads 60 are deposited, preferably by silk-screening, in a single process step. The ground electrode surface of film 54 is adhered to the substrate 50 with a suitable adhesive or fastener. The key electrodes need not be rectangularly configured and may be circular, for example, and of less area than the area represented by cut-out portions 52. Of course, the grounded surface may comprise localized silk-screened deposits, as discussed hereinabove. Each individual row of key electrodes in FIG. 3B have their leads 60 disposed along an X-axis to form an assembly 62.

Another assembly, similar to assembly 62, is formed, but with the leads of each column disposed along a Y-axis. The final composite will have an electrically insulating film therebetween similar to composite 40, the key electrodes of each assembly being in face-to-face relationship. Ground electrodes, if desired, may be readily connected by means of plated through hole techniques.

The direction of stretch of PVDF films 54 provides $d_{31}$ outputs which coincide with the longer dimension of the rectangular cut-out portion 52.

The film substrate thickness may range between about 6 to $25\mu$. The thicknesses of the PVDF films, electrodes, and film separating the PVDF films may be identical with those comprising composite 40.

I claim:

1. In a keyboard switch including a pair of poled piezoelectric films having metallic electrodes disposed thereon, said switch comprising a pair of electrically insulating substrates having a plurality of spaced identical cut-out openings in each, said pair of poled piezoelectric films each having a plurality of ground electrodes deposited on one surface thereof and a plurality of signal generating key electrodes deposited over other surface, each of said substrates having one of said grounded electrode surfaces adhered thereto over said openings, said key electrodes and ground electrodes being in substantial registration with openings in substrate associated therewith, said key electrodes having leads connecting individual rows on one piezoelectric film disposed orthogonally to leads connecting individual columns on other of said piezoelectric film, an insulating sheet disposed between said piezoelectric films, said films having their key electrode surfaces in face-to-face relationship, the improvement to said switch comprising:

said ground electrodes and said key electrodes having thicknesses ranging between about 5 to 7 microns and comprised of finely divided electrically conductive metal embedded in a polymer matrix whereby said electrodes and polymer film may be successfully deflected and strained millions of times.

2. The keyboard switch of claim 1 wherein said ground electrodes cover entire surface of one surface of each of said piezoelectric films.

3. The switch of claim 1 wherein said electrically conductive metal is silver.

4. The switch of claim 1 wherein said electrically conductive metal is copper.

5. The switch of claim 2 wherein said electrically conductive metal is nickel.

* * * * *